(12) United States Patent
Tago (10) Patent No.: US 8,791,544 B2
(45) Date of Patent: Jul. 29, 2014

(54) SEMICONDUCTOR DEVICE, MOUNTED SUBSTRATE TO BE USED IN SEMICONDUCTOR DEVICE, AND MANUFACTURING METHOD OF MOUNTED SUBSTRATE

(75) Inventor: Masamoto Tago, Tokyo (JP)

(73) Assignee: NEC Corporation, Tokyo (JP)

( * ) Notice: Subject to any disclaimer, the term of this patent is extended or adjusted under 35 U.S.C. 154(b) by 23 days.

(21) Appl. No.: 13/379,274

(22) PCT Filed: Jun. 23, 2010

(86) PCT No.: PCT/JP2010/061092
§ 371 (c)(1),
(2), (4) Date: Dec. 19, 2011

(87) PCT Pub. No.: WO2011/001992
PCT Pub. Date: Jan. 6, 2011

(65) Prior Publication Data
US 2012/0098089 A1    Apr. 26, 2012

(30) Foreign Application Priority Data

Jun. 30, 2009    (JP) .................................. 2009-156330

(51) Int. Cl.
*H01L 27/08*    (2006.01)
(52) U.S. Cl.
USPC ............ 257/531; 257/E27.046; 257/E21.499; 257/E29.323
(58) Field of Classification Search
None
See application file for complete search history.

(56) References Cited

U.S. PATENT DOCUMENTS

2009/0140359 A1*   6/2009   Nakashiba .................... 257/428

FOREIGN PATENT DOCUMENTS

| JP | 8-273963 A | 10/1996 |
|---|---|---|
| JP | 10-200007 A | 7/1998 |
| JP | 2002110865 A | 4/2002 |
| JP | 2002164468 A | 6/2002 |
| JP | 2008091627 A | 4/2006 |
| JP | 2007235034 | 9/2007 |
| JP | 2007318003 A | 12/2007 |

OTHER PUBLICATIONS

International Search Report for PCT/JP2010/061092 mailed Sep. 21, 2010.

* cited by examiner

*Primary Examiner* — Mamadou Diallo
(74) *Attorney, Agent, or Firm* — Sughrue Mion, PLLC (57) ABSTRACT

[Problem to be Solved] A semiconductor element having fine pitch electrodes is mounted on a substrate at low cost without reducing the number of input-output terminals.
[Solution] Electrodes 1 for electrical connection and first inductors 2, arranged between the electrodes 1 in a manner neighboring the electrodes 1, for electromagnetic coupling are arranged on one main surface of the semiconductor element 3. On a substrate 5, second inductors 4 for electromagnetically coupling with the first inductors 2 are arranged in positions corresponding to the first inductors 2. The semiconductor element 3 is mounted on the substrate 5 so that the first and second inductors 2 and 4 face each other. Only desired input/output signals among input/output signals of the semiconductor element 3 are inputted or outputted from the external electrodes 11 of the substrate 5 in a manner being transmitted contactlessly by electromagnetic coupling between the first and second inductors 2 and 4 without going through the electrodes 1.

18 Claims, 7 Drawing Sheets

SEMICONDUCTOR DEVICE, MOUNTED SUBSTRATE TO BE USED IN SEMICONDUCTOR DEVICE, AND MANUFACTURING METHOD OF MOUNTED SUBSTRATE

TECHNICAL FIELD

The present invention relates to a semiconductor device, a mounting substrate used in the semiconductor device and a manufacturing method of the mounting substrate, and, more particularly, to a substrate, a semiconductor device having the substrate and a manufacturing method of the substrate wherein a semiconductor device arranging a first inductor, for electromagnetically coupling to a main surface of the substrate, is mounted on the substrate arranging a second inductor, corresponding to the first inductor, for electromagnetically coupling to the first inductor, so that electromagnetic coupling between the first inductor and the second inductor is possible.

BACKGROUND ART

In recent years, along with development of semiconductor manufacturing technology, the number of electrodes (the number of terminals) of a semiconductor element (semiconductor chip) included in a main portion of a semiconductor device such as an LSI is increasing, and thus, in an electrode arranged in a periphery of the semiconductor element, a trend toward a fine pitch (narrow pitch) electrode is progressing. For this reason, a flip chip connection technology is used widely instead of a method of a related art in which each electrode and an outside member (such as an electrode on a substrate) are electrically connected by wire bonding. In this flip chip connection technology, not only the peripheral part of the semiconductor element but also the whole plane part is utilized, and the electrodes are arranged in a form of an area array so that the number of electrodes may increase significantly without using a fine pitch electrode. Each electrode and an outside member are electrically connected directly using these area-array arranged electrodes.

Further increase of the number of electrodes has been required also in a semiconductor element included in a semiconductor device of the flip chip connection type. As a result, in order to support a fine pitch electrode, the number of layers in a substrate has been increased. For this reason, a number of manufacturing processes has increased, and introducing a special material or the like has become necessary, thereby a manufacturing yield declines.

In the case of a semiconductor device of a multi-chip type in which a plurality of semiconductor elements are mounted on a substrate by a flip chip connection, further scaling down of dimensions is required for the substrate. In this semiconductor device, due to increase of the number of electrodes, the number of connection points between the electrodes and outside members increases. Not only that, scaling down of dimensions of a bump (projection-shaped electrode), which undertakes a role of: electrically connecting an electrode of a semiconductor element and an electrode arranged on the substrate corresponding to the electrode of the semiconductor; and keeping an interval between the semiconductor element and the substrate at a predetermined distance, is inevitable. In order to make a gap between the semiconductor element and the substrate narrower, a small sized (low height) bump is needed. The cost increases due to a small sized bump.

Figure 13:
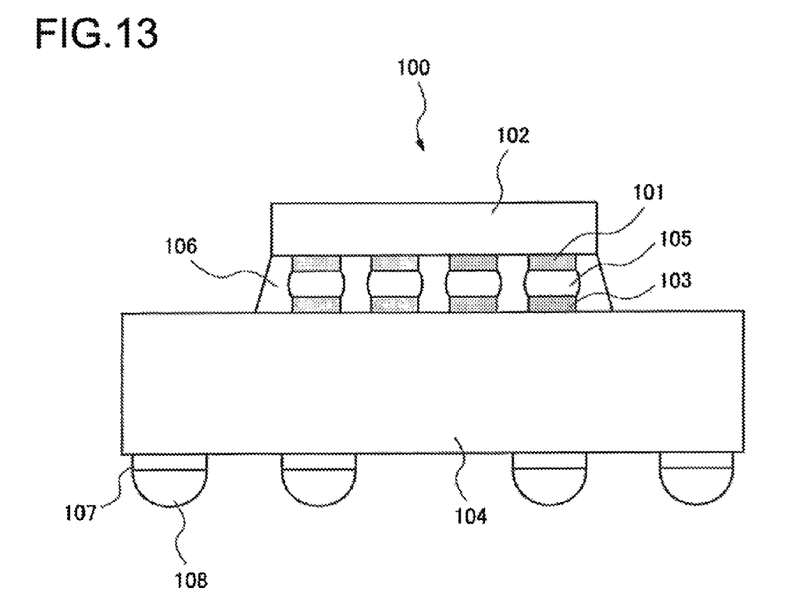
FIG. 13 is a sectional view showing a schematic configuration of a semiconductor device according to the first related technology.

FIG. 13 indicates a sectional view of a semiconductor device 100 of a flip chip connection type according to a first related technology. As shown in FIG. 13, in the semiconductor device 100, a semiconductor element 102 having a first electrode 101, arranged on its one main surface, for electrically connecting to an outside member, is mounted on a substrate 104 having a second electrode 103 arranged on it corresponding to the first electrode 101 so that the first electrode 101 and the second electrode 103 are electrically connected via a bump 105.

Figure 14:
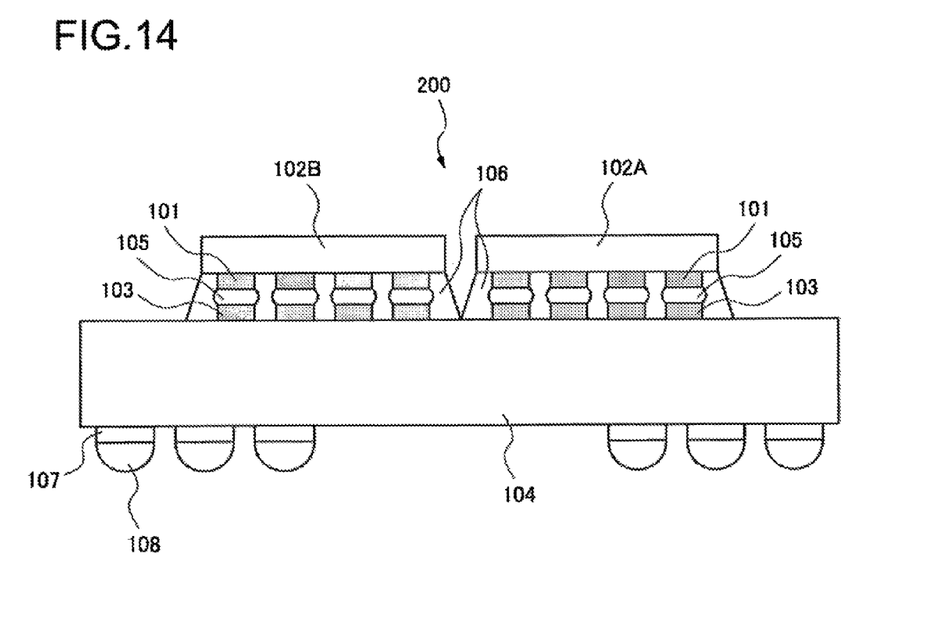
FIG. 14 is a sectional view showing a schematic configuration of a semiconductor device according to the second related technology.

In order to protect a connecting point, such as the electrode 101 and 103 from the surrounding atmosphere, a sealing body 106 is formed by resin filling. An external electrode 107 is arranged on the back of the substrate 104 so as to be electrically connected to the second electrode 103. A bump 108 is electrically connected to the external electrode 107. FIG. 14 indicates a sectional view of a multi-chip type semiconductor device 200 by a flip chip connection according to the second related technology. In the semiconductor device 200, as shown in FIG. 13, two of semiconductor elements 102A and 102B are mounted on the common substrate 104 in approximately the same structure as FIG. 13.

However, in these flip chip connection type semiconductor devices as above, there are several problems. First, by the fine pitch electrode of the semiconductor element, the height of the bump also becomes low, and a gap between the semiconductor element and the substrate becomes small. Filling cleaning solution or the like into this gap becomes difficult. For this reason, due to deterioration of the flux detergency, degradation of a UF (underfill) resin filling property or the like, the productivity declines. In addition, according to the increase of the number of connection points due to increase of the number of the electrodes, a connection yield for the electrodes declines. Further, compared with the dimensional scaling down of the electrode and the bump of the semiconductor element, scaling down of the substrate requires higher technology. That is, in processing the semiconductor element, silicon with a high flatness is used as a substrate material, and a manufacturing apparatus has high accuracy. On the other hand, in processing the substrate, metal wiring is formed on a base material of resin or glass cloth saturated with resin or the like. As has been mentioned above, in order to dimensionally scale down the substrate, increase of the number of processes by the high multilayering, introduction of the special material and degradation of the manufacturing yield according to them cannot be avoided. For this reason, the cost becomes high. In addition, for the semiconductor device of the multi-chip type on which the plurality of semiconductor elements are mounted, because further scaling down is required, the cost of the substrate becomes yet higher.

On the other hand, in order to speed up for the semiconductor device and reduce a burden on the semiconductor element, there is disclosed a semiconductor device in which a semiconductor element is flip-chip connected on a substrate via an interposer including a semiconductor substrate on which an active element is formed (patent document 1). However, in this semiconductor device, because a semiconductor substrate of such as silicon is used, although the interposer substrate is advantageous for scaling down, scaling down a connection section between the interposer substrate and a base board is difficult. In addition, in the interposer substrate, in order to connect to the base board, wiring needs to be formed on the back of the interposer substrate. Formation of penetration wiring to the semiconductor substrate requires high cost. For this reason, there is also a drawback that the cost of the interposer substrate becomes high. Further, because an active element is formed on this interposer substrate, there is a shortcoming such that the manufacturing steps increases, thereby the cost up becomes inevitable.

Also disclosed is a semiconductor device in which, in order to increase the number of signals inputted between a chip and a substrate without increasing the area of the chip and the substrate, a chip having first inductor conductors formed corresponding to a part of input-output terminals is mounted on a substrate having second inductor conductors formed corresponding to the first inductor conductors and external connection terminals formed corresponding to the second inductor conductors (patent document 2). The first and second inductor conductors are magnetically coupled, and a signal is transmitted by the electromagnetic induction between the chip and the substrate.

Further, there is disclosed a semiconductor device having a plurality of semiconductor chips, each having an inductor for communication, being laminated and being inductor-connected to each other, wherein, in order to prevent decline of a magnetic field strength of an inductor due to an eddy current generated in a chip, the semiconductor device includes: a semiconductor layer arranged on a semiconductor substrate having a first resistivity, the semiconductor layer having a second resistivity smaller than the first resistivity; a wiring layer on this semiconductor layer; and an inductor, provided in this wiring layer, for performing sending and receiving a signal (patent document 3).

RELATED ART DOCUMENT

Patent Document

[Patent document 1] Japanese Patent Application Laid-Open No. 2002-110865
[Patent document 2] Japanese Patent Application Laid-Open No. 1998-200007
[Patent document 3] Japanese Patent Application Laid-Open No. 2007-318003

DISCLOSURE OF THE INVENTION

Problems to be Solved by the Invention

The semiconductor device disclosed in the patent document 2 transmits the signal using the magnetic coupling between the chip and the substrate. A signal waveform received by the inductor attenuates when the wiring distance becomes long, because the received current is a driven current. A connection with other electronic parts constituting system instrument is difficult to be realized only by setting up the inductor to the substrate. The semiconductor device is not applied to signal transmission between a plurality of parts. Also, in the patent document 2, in contrast with the present invention, it is not considered to mount a semiconductor element having fine pitch electrodes on a substrate with a low cost without reducing the number of input-output terminals, and furthermore, to improve a connection yield by reducing the number of the connection points electrically connecting an electrode of a semiconductor element with an outside member.

In the semiconductor device disclosed in patent document 3, although the plurality of semiconductor chips are laminated and inductor-coupled to each other, when the frequency of use of the chip-laminated type semiconductor device is low, the strength of the magnetic field of the inductor is rarely influenced by the eddy current generated in the chip. In addition, also in the patent document 3, as in the case of the patent document 2, in contrast with the present invention, it is not considered to mount a semiconductor element having fine pitch electrodes on a substrate with a low cost without reducing the number of input-output terminals, and furthermore, to improve a connection yield by reducing the number of the connection points electrically connecting an electrode of a semiconductor element with an outside member.

An object of the present invention is to provide a semiconductor device, a mounting substrate used in the semiconductor device and a manufacturing method of the mounting substrate which settle the problems mentioned above.

Means for Solving the Problems

A semiconductor device of the present invention has a semiconductor element and a substrate. The semiconductor element includes: a first main surface, on which a first inductor is arranged; a second main surface; and a first electrode arranged on the first main surface or the second main surface. The substrate is mounted on the semiconductor element, and includes: a second inductor, arranged in a position corresponding to the first inductor, for electromagnetically coupling with the first inductor; and an external electrode for inputting or outputting at least a part of signal inputted to the semiconductor element or outputted from the semiconductor element, the signal being transmitted by a contactless electromagnetic coupling between the first inductor and the second inductor.

A mounting substrate of the present invention mounts a semiconductor element, which has a first inductor and a first electrode. The mounting substrate includes: an inductor element, on which a second inductor electromagnetically coupling with the first inductor is arranged in a position corresponding to the first inductor; and an external electrode for inputting or outputting at least a part of signal inputted to the semiconductor element or outputted from the semiconductor element, the signal being transmitted by a contactless electromagnetic coupling between the first inductor and the second inductor.

A manufacturing method of a mounting substrate for mounting a semiconductor element, which has a first inductor and a first electrode, of the present application includes: a step of arranging a second inductor electromagnetically coupling with the first inductor on a first surface of an inductor element formed inside a substrate or on a surface of the substrate in a position corresponding to the first inductor; and a step of forming an external electrode for inputting or outputting at least a part of signal inputted to the semiconductor element or outputted from the semiconductor element, the signal being transmitted by a contactless electromagnetic coupling between the first inductor and the second inductor.

Advantages of the Invention

According to a semiconductor device of the present invention, in a structure in which a semiconductor device arranging first inductors for electromagnetic coupling to its one main surface is mounted on a substrate arranging second inductors, corresponding to the first inductors, for electromagnetically coupling to the first inductors, so that electromagnetic coupling between the first inductors and the second inductors may be possible, because electrodes for electrically connecting with an outside member are arranged on the one main surface or the other main surface of the semiconductor element, and at least part of input/output signals of the semiconductor element are transmitted in a contactless manner and inputted to or outputted from external electrodes arranged on the substrate, it is possible to mount a semiconductor element having fine pitch electrodes on a substrate at low cost without reducing the number of its input-output terminals. Also, it is possible to reduce the number of connection points that electrically connect an electrode of a semiconductor element to an outside member, thereby improving a connection yield.

DESCRIPTION OF EMBODIMENTS

[Exemplary Embodiment 1]

Figure 1:
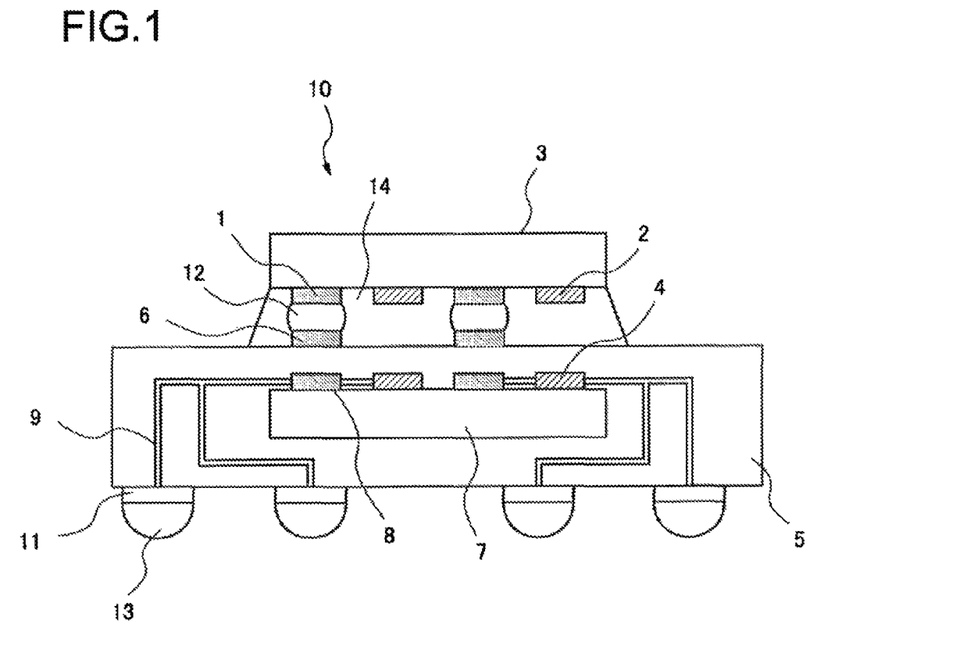
FIG. 1 is a sectional view showing an example of a schematic configuration of a semiconductor device according to a first exemplary embodiment of the present invention.

FIG. 1 is a sectional view showing a schematic configuration of a semiconductor device 10 according to the first exemplary embodiment of the present invention.

The semiconductor device 10 includes a semiconductor element 3 and a substrate 5.

Electrodes 1 connected with the substrate 5 electrically are arranged on one main surface of the semiconductor element 3, and first inductors 2 for performing electromagnetic coupling are arranged between the electrodes 1, in a manner neighboring the electrodes 1.

On the substrate 5, second inductors 4 electromagnetically coupled with the first inductors 2 are arranged in positions corresponding to the first inductors 2.

The semiconductor element 3 is mounted on the substrate 5 so that the first inductors 2 and the second inductors 4 face each other. Here, the electrodes 1 and the first inductors 2 arranged on the one main surface of the semiconductor element 3 include input-output terminals of the semiconductor element 3.

The substrate 5 is made of an insulating material and electrodes 6 are arranged on the surface facing the one main surface of the semiconductor element 3 in positions corresponding to the electrodes 1. The second inductors 4 are formed on the surface of an inductor element 7 made of an insulating substrate. The inductor element 7 is incorporated in the substrate 5 in a face-up direction so that the second inductors 4 face the first inductors 2. In this case, the manufacturing step of the substrate 5 includes embedding the inductor element 7 in the insulating resin which is the material of the substrate 5 in advance, and a via in a connection section using photography treatment technology or the like, to form an electrical connection part. Although the second inductors 4 and the electrodes 6 for transmitting a signal only have to be formed into the inductor element 7, in order to realize more highly reliable signal transmission, the inductor element 7 may include a circuit having an active function for modulating, demodulating or amplifying a signal inputted from the semiconductor element 3. Such active function of the circuit can also be used when a signal is inputted from an external device to the semiconductor element 3.

Electrodes 8 are formed on the surface of the inductor elements 7. These electrodes 8 are electrically connected with external electrodes 11 arranged in the back of the substrate 5 (in FIG. 1, the lower part of the substrate 5) through wiring 9 formed in the substrate 5. Hemisphere electrodes 13 connected to another electronic part are arranged on the external electrodes 11. Meanwhile, these hemisphere electrodes 13 are an example, and other electrodes such as a PGA (pin grid array) may be employed as an electrode connected to the external electrodes 11. In order to protect a connecting point such as the electrodes 1 from the surrounding atmosphere, a sealing body 14 is formed by resin filling.

Figure 2:
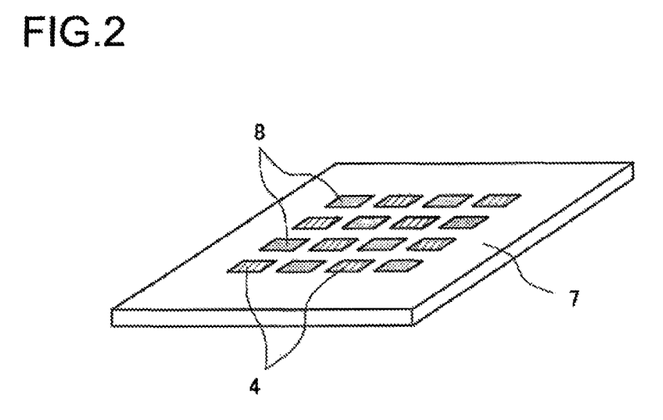
FIG. 2 is a perspective view showing an example of a schematic configuration of an inductor element used in the semiconductor device according to the first exemplary embodiment.

FIG. 2 is a perspective view showing a schematic configuration of a layout pattern of the electrodes 8 and the second inductors 4 arranged in the upper side of the inductor element 7 (in FIG. 1, the upper part of the inductor element 7) according to the first exemplary embodiment of the present invention. FIG. 2 indicates, as an example, a structure in which the electrodes 8 and the second inductors 4 are arranged alternately in a planar manner.

As mentioned later, because, when bumps 12 are connected to the electrodes 1, the bumps 12 are unnecessary for the first inductors 2, the bumps 12 do not need to be limited to a small size if the electrodes 1 and the first inductors 2 are arranged alternately. A layout pattern of the electrodes 8 and the second inductors 4 is not limited to this layout pattern, but may have a pattern that arranges the second inductors 4 in a manner having the effect of this exemplary embodiment.

The electrodes 1 of the semiconductor element 3 are connected to the electrodes 6 of the substrate 5 corresponding to the electrodes 1 via the bumps 12 which are projection-shaped electrodes. The electrodes 1 are further connected electrically to the external electrodes 11 through wiring of the substrate 5 that is not illustrated. The bumps 12 undertake a role of keeping a gap between the semiconductor element 3 and the substrate 5 when the semiconductor element 3 is mounted on the substrate 5.

The number of input-output terminals of the semiconductor element 3 is a sum of the total number of the electrodes 1 and the total number of the first inductors 2 arranged in the one main surface. Accordingly, by adjusting the number of the first inductors 2 appropriately according to the purpose, the use or the like of a produced semiconductor device, the number of the electrodes 1 can be reduced, and then the number of the required bumps 12 can also be reduced. According to the purpose, the use or the like, it may be changed or selected optionally whether a signal is transmitted using electromagnetic coupling between the first inductors 2 and the second inductors 4 or a signal is transmitted using electrical connection between the electrodes 1 and the electrodes 6. As an example, it may be such that electrical connection is used for supply of power and ground, and electromagnetic coupling is used for only signal transmission.

By the aforementioned structure, desired input/output signals among input/output signals of the semiconductor element 3 are transmitted in a contactless manner by electromagnetic coupling between the first and second inductors 2 and 4 without going through the electrodes 1, and inputted and outputted via the external electrodes 11 of the substrate 5. Accordingly, even if the semiconductor element 3 has fine pitch electrodes, the bumps 12 of the number of the first inductors 2 (or, the second inductors 4) are unnecessary. As a result, because it is possible to use a bump of an enough size which can be manufactured at low cost without miniaturizing it as is the case with the conventional way, an interval between the semiconductor element 3 and the substrate 5 may be wide. Because cleaning solution or the like can be filled sufficiently in the gap in this interval, improvement of the flux detergency, improvement of the UF resin filling property and the like can be achieved, and thus the productivity is improved. For example, when the number of the electrodes 1 of the semiconductor element 3 is equal to the number of the first inductors 2, the connection pitch of the electrodes 1 for electric connection decreases by about half, according to this exemplary embodiment.

The bumps 12 determine a position and a distance on the one main surface where an input/output signal can be transmitted contactlessly by electromagnetic coupling between the first inductors 2 and the second inductors 4. By this, a range on the one main surface within which an input/output signal can be transmitted is controlled by the bumps 12.

Also, because signal transmission of the semiconductor element 3 is performed using electromagnetic coupling between the first and second inductors 2 and 4, use of the electrical connection of an electrode 1 decreases. As a result, connection yield of the electrical connection improves.

As above, in the semiconductor device 10 of the first exemplary embodiment, the semiconductor element 3 is mounted on the substrate 5. On the one main surface of the semiconductor element 3, the electrodes 1 for performing an electrical connection, and the first inductors 2 for performing electromagnetic coupling, each being arranged between the electrodes 1 and neighboring the electrodes 1, are arranged. On the substrate 5, there are arranged the second inductors 4 for electromagnetically coupling with the first inductors 2 in positions corresponding to the first inductors 2. The semiconductor element 3 is mounted on the substrate 5, so that the first inductors 2 and the second inductors 4 face each other. In such semiconductor device, only desired input/output signals among input/output signals of the semiconductor element 3 are transmitted contactlessly by electromagnetic coupling between the first and second inductors 2 and 4 without going through the electrodes 1, and inputted or outputted from the external electrodes 11 of the substrate 5. Accordingly, signal transmission using the electrical connection by the electrodes 1 can be reduced substantially.

Accordingly, it is possible to mount a semiconductor element having fine pitch electrodes on a substrate at low cost without reducing the number of input-output terminals of the electrodes.

Also, by reducing the number of connection points for electrically connecting an electrode of a semiconductor element with an outside member, the connection yield improves.

[Modification 1]

Figure 3:
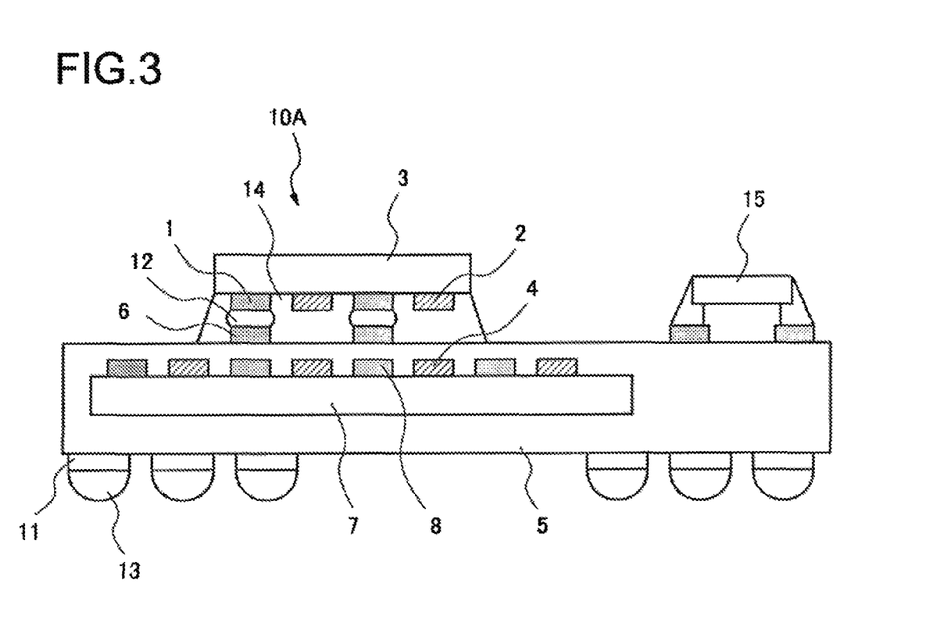
FIG. 3 is a sectional view showing an example of a schematic configuration of a semiconductor device according to a modification of the first exemplary embodiment of the present invention.

FIG. 3 is a sectional view showing a schematic configuration of a modification of the first exemplary embodiment of a semiconductor device of the present invention. The semiconductor device of this modification is different from the semiconductor device of the first exemplary embodiment mentioned above in a point that, when a semiconductor element of a various kinds of size is mounted on a substrate by enlarging the size of an inductor element, standardization of the inductor element (utilization of a universal shape) is realized.

That is, as shown in FIG. 3, in a semiconductor device 10A of this modification, the size of the inductor element 7 is sufficiently larger than the size of the semiconductor element 3, and a sufficiently large number of second inductors 4 and electrodes 8 are arranged so that it can coping with a case even where a large sized semiconductor element is mounted. Further, on the semiconductor device 10A, as an example of other electronic parts mounted on the substrate 5, a chip part 15 such as a resistor is arranged. This modification example is identical with the first exemplary embodiment mentioned above besides these features. Therefore, in FIG. 3, a same number is given to each element corresponding to a component in FIG. 1, and description thereof will be omitted.

Thus, according to this modification, by making the size of the inductor element large in advance in order to cope with the case even where a semiconductor element of a different size is mounted, standardization (universalization) of an inductor element can be achieved. Consequently, almost the same effect as the effect described in the first exemplary embodiment is obtained. In addition, by the standardization, the cost for the substrate is lowered.

[Exemplary Embodiment 2]

Figure 4:
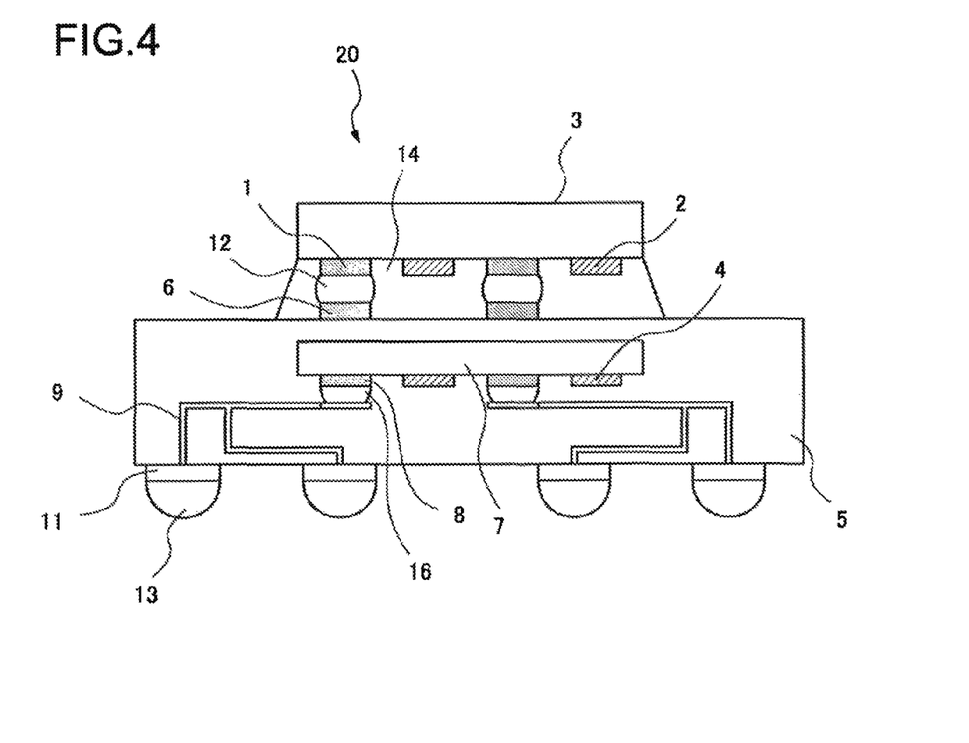
FIG. 4 is a sectional view showing an example of a schematic configuration of a semiconductor device according to a second exemplary embodiment of the present invention.

FIG. 4 is a sectional view showing a schematic configuration of a semiconductor device which is the second exemplary embodiment of the present invention. The semiconductor device of this exemplary embodiment is different from the semiconductor device of the first exemplary embodiment in a point that the inductor element is incorporated into the substrate in a face down manner.

As shown in FIG. 4, in the semiconductor device 20 of the second exemplary embodiment, the inductor element 7 is incorporated into the substrate 5 in a face down manner so that the second inductors 4 are arranged on the opposite side of the first inductors 2. Electric connection between the electrodes 8 of the inductor element 7 and the wiring 9 is made via bumps 16. When the inductor element 7 is incorporated into the substrate 5 in a face down manner, as in this second exemplary embodiment, electromagnetic coupling between the second inductors 4 and the first inductors 2 is made via the back of the inductor element 7. In this case, in the manufacturing steps of the substrate 5, forming of a via in a connection section using a photography treatment technology or the like, as in the case of the manufacturing steps of the substrate 5 according to the first exemplary embodiment, is unnecessary. Because the substrate 5 of this exemplary embodiment can be implemented by bump mounting, for example, there is an effect that the production cost of the substrate is reduced.

Meanwhile, a common member with that of the first exemplary embodiment is given an identical number, and description thereof will be omitted.

Thus, according to the second exemplary embodiment, because the inductor element is arranged so as to be incorporated in the substrate in a face down manner, almost the same effect as the effect described in the first exemplary embodiment is obtained. Also, it has an effect that the production cost of a substrate can be reduced.

[Exemplary Embodiment 3]

Figure 5:
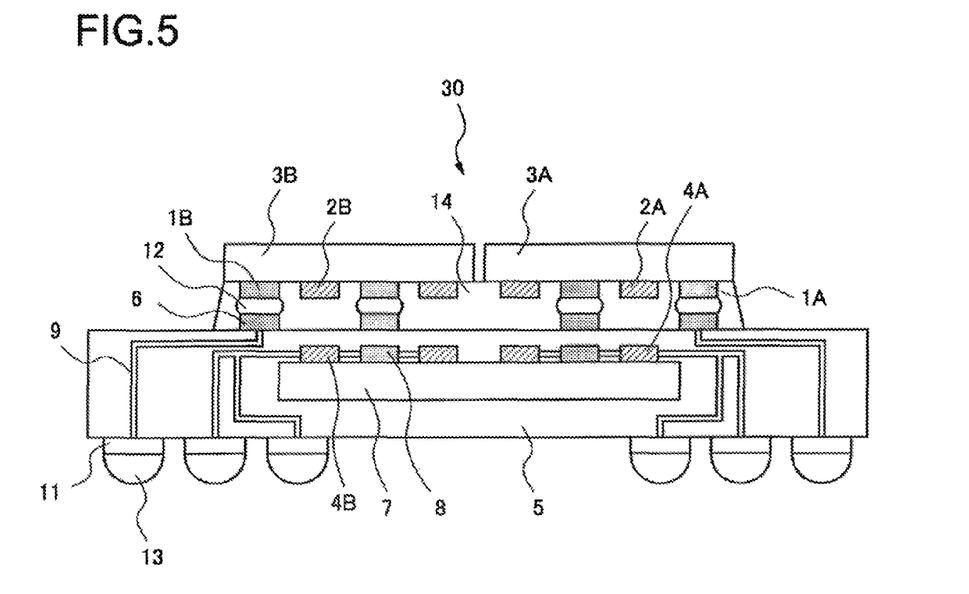
FIG. 5 is a sectional view showing an example of a schematic configuration of a semiconductor device according to a third exemplary embodiment of the present invention.

FIG. 5 is a sectional view showing a schematic configuration of a semiconductor device which is the third exemplary embodiment of the present invention. The structure of the semiconductor device of this exemplary embodiment is different from the structure of the semiconductor device of the above-mentioned first exemplary embodiment in a point that it is applied to a semiconductor device of a multi-chip type.

In a semiconductor device 30 of the third exemplary embodiment, semiconductor elements 3A and 3B are mounted on the substrate 5 as shown in FIG. 5. In each of the semiconductor elements 3A and 3B, electrodes 1A and 1B for electric connection are arranged on the one main surface, and first inductors 2A and 2B for performing electromagnetic coupling, each being arranged between the electrodes 1A and 1B and neighboring the electrodes 1A and 1B, are arranged. In the substrate 5, second inductors 4A and 4B for electromagnetically coupling with these first inductors 2A and 2B are arranged in positions corresponding to the first inductors 2A and 2B. The semiconductor elements 3A and 3B are mounted on the substrate 5 so that the first inductors 2A and 2B and the second inductors 4A and 4B may face each other.

Here, the inductor element 7 has a common structure which can cope with both of the two semiconductor elements 3A and 3B. Because, according to the structure, the two semiconductor elements 3A and 3B can be supported commonly using the single inductor element 7, when input/output signals of the semiconductor elements 3A and 3B are transmitted by the electromagnetic coupling, a high speed signal transmission can be realized.

Meanwhile, an identical number is given to a member the same as that of the first exemplary embodiment, and description thereof will be omitted.

Thus, according to the third exemplary embodiment, because, when a plurality of semiconductor elements are mounted on a substrate, a common inductor element which can cope with the plurality of semiconductor elements is used, almost the same effect as the effect described in the first exemplary embodiment is obtained. In addition, a high speed signal transmission can be performed in the semiconductor device according to the third exemplary embodiment.

[Modification 2]

Figure 6:
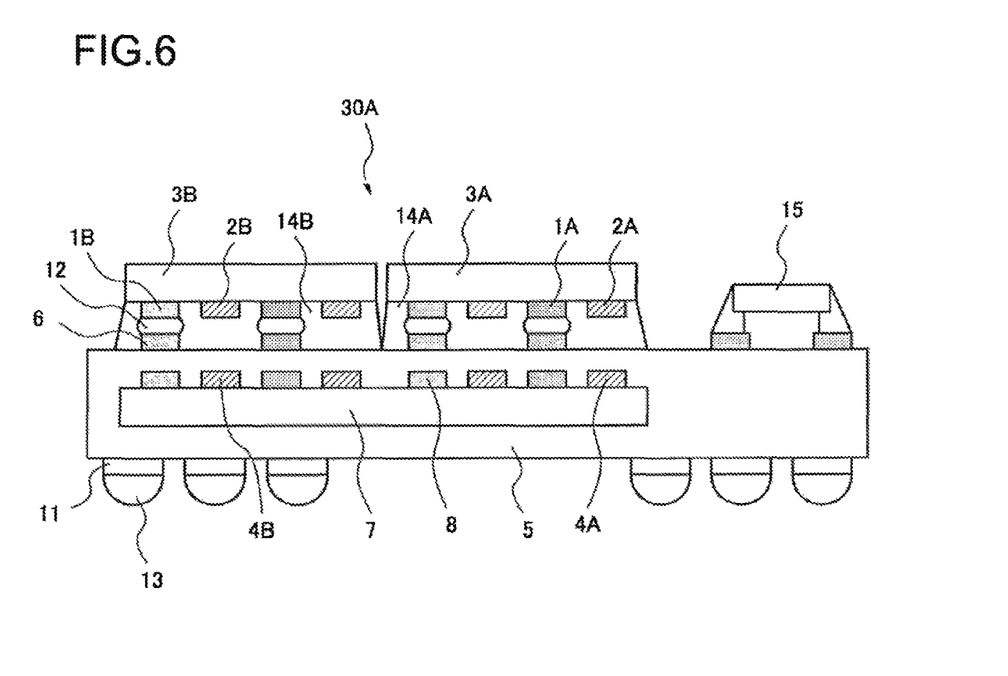
FIG. 6 is a sectional view showing an example of a schematic configuration of a semiconductor device according to a modification of the third exemplary embodiment of the present invention.

FIG. 6 is a sectional view showing a schematic configuration of the semiconductor device which is a modification example of the third exemplary embodiment. The structure of the semiconductor device of this modification is different from the structure of the semiconductor device of the above-mentioned third exemplary embodiment in a point that a sealing body is formed for each semiconductor element.

That is, in the semiconductor device 30A of this modification, as shown in FIG. 6, the sealing bodies 14A and 14B are formed for each of the semiconductor elements 3A and 3B. The chip part 15 such as a resistor is mounted on the substrate 5, as an example of other electronic parts.

Thus, according to the modification example of the third exemplary embodiment, because the structure of the semiconductor device of the multi-chip type is almost identical with the structure of the semiconductor device according to the third exemplary embodiment, almost the same effect as the effect described in the third exemplary embodiment is obtained.

[Exemplary Embodiment 4]

Figure 7:
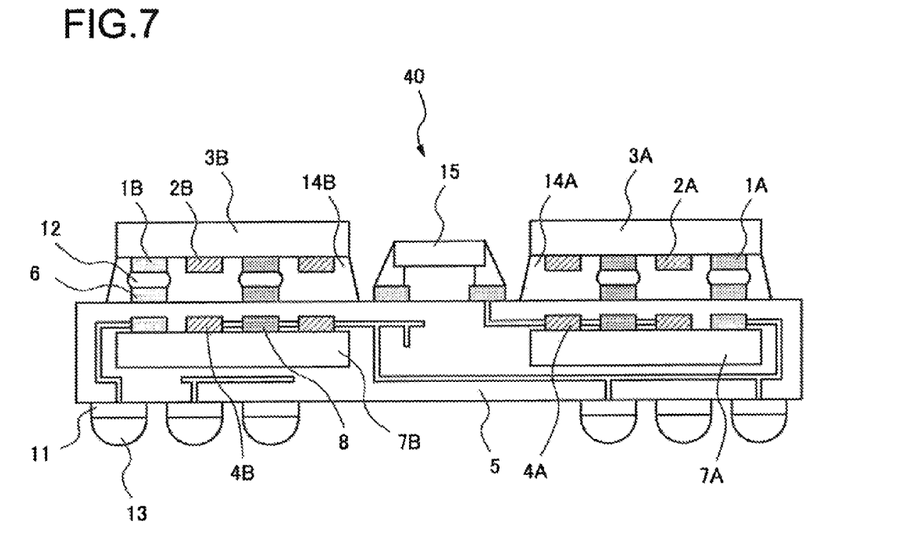
FIG. 7 is a sectional view showing an example of a schematic configuration of a semiconductor device according to a fourth exemplary embodiment of the present invention.

FIG. 7 is a sectional view showing a schematic configuration of a semiconductor device according to the fourth exemplary embodiment of the present invention. The structure of the semiconductor device of this exemplary embodiment is different from the structure of the third exemplary embodiment mentioned above in a point that, in the semiconductor device of the multi-chip type, an inductor element is incorporated in a substrate for each semiconductor element.

In a semiconductor device 40 of the fourth exemplary embodiment, as shown in FIG. 7, the inductor elements 7A and 7B are incorporated in the substrate 5 corresponding to the semiconductor elements 3A and 3B, respectively. Because there is a difference in specifications such as the number of pins and a layout depending on each of the semiconductor elements 3A and 3B, by combining the inductor elements 7A and 7B which conform to such specification with the semiconductor elements 3A and 3B respectively, the most suitable signal transmission of input/output signals of each of the semiconductor elements 3A and 3B can be performed. Meanwhile, a common inductor element corresponding to the plurality of inductor elements 7A and 7B may be arranged.

Meanwhile, an identical number is given to a member the same as that of the first exemplary embodiment, and description thereof will be omitted.

Thus, according to the fourth exemplary embodiment, because even when a plurality of semiconductor elements each having a different specification are mounted, the inductor elements according to the respective specifications are combined, almost the same effect as the effect described in the third exemplary embodiment is obtained. Further, the most suitable signal transmission of input/output signals of each semiconductor element can be performed.

[Exemplary Embodiment 5]

Figure 8:
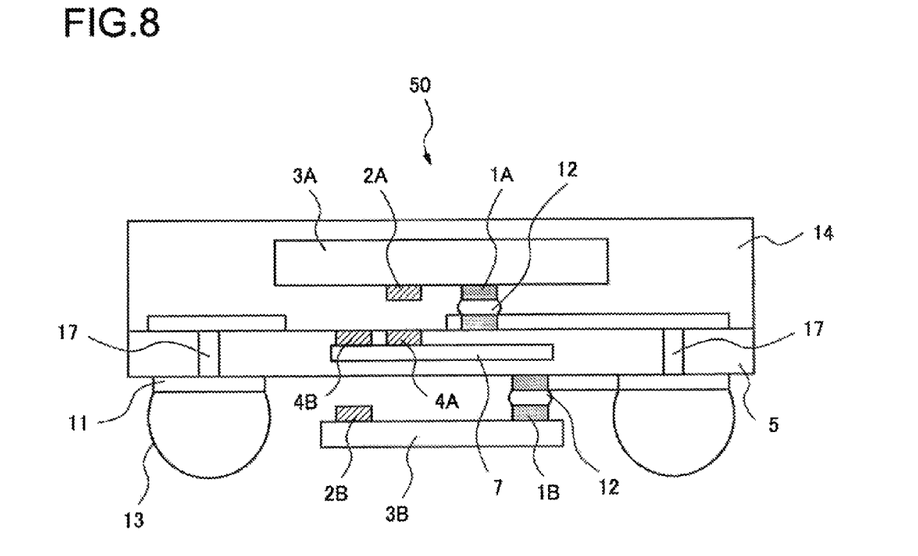
FIG. 8 is a sectional view showing an example of a schematic configuration of a semiconductor device according to a fifth exemplary embodiment of the present invention.

FIG. 8 is a sectional view showing a schematic configuration of the semiconductor device according to the fifth exemplary embodiment of the present invention. The structure of a semiconductor device of this exemplary embodiment is different from the semiconductor device of the above-mentioned first exemplary embodiment in a point that semiconductor elements are mounted on both sides of a substrate, respectively.

As shown in FIG. 8, in a semiconductor device 50 of the fifth exemplary embodiment, a semiconductor element 3A is arranged on the surface of the inductor element 7 incorporated in the substrate 5. On the other hand, a semiconductor element 3B is arranged on the back of the inductor element 7. The first inductors 2A and 2B of the semiconductor elements 3A and 3B face the second inductors 4A and 4B arranged on the surface of the inductor element 7, respectively. Penetration electrodes 17 are formed into the substrate 5.

By such a structure, because transmission of input/output signals of the semiconductor elements 3A and 3B is performed using the both sides of the substrate 5 and the both sides of the inductor element 7 by electromagnetic coupling, a margin can be secured in the degree of scaling down of a pitch of the electrodes 1A and 1B arranged in the semiconductor elements 3A and 3B, respectively.

Meanwhile, an identical number is given to a member the same as that of the first exemplary embodiment, and description thereof will be omitted.

Thus, according to the fifth exemplary embodiment, because semiconductor elements are mounted on the both sides of the substrate, respectively, almost the same effect as the effect described in the first exemplary embodiment is obtained. A margin can be obtained in the degree of scaling down of the pitch of an electrode arranged in a semiconductor element.

[Exemplary Embodiment 6]

Figure 9:
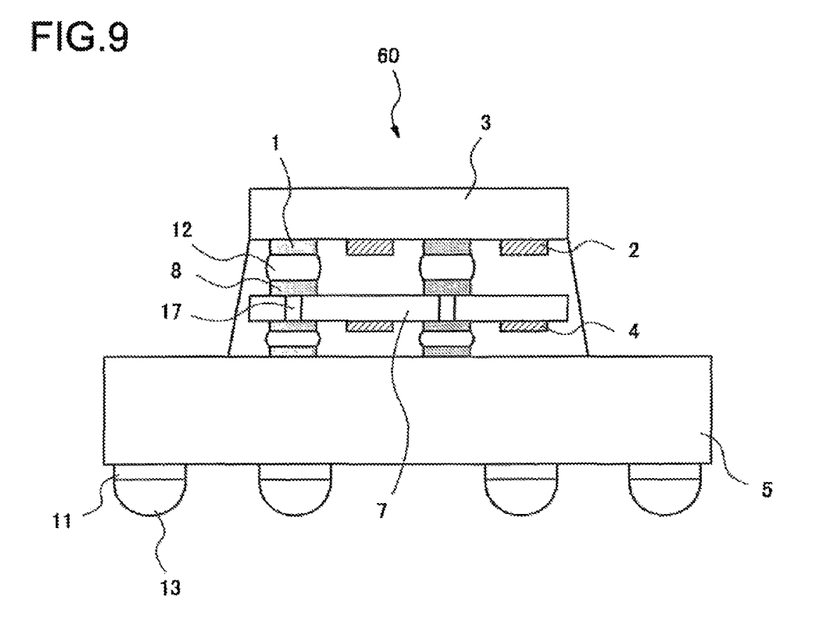
FIG. 9 is a sectional view showing an example of a schematic configuration of a semiconductor device according to a sixth exemplary embodiment of the present invention.

FIG. 9 is a sectional view showing a schematic configuration of a semiconductor device which is the sixth exemplary embodiment of the present invention. The structure of the semiconductor device of this exemplary embodiment is different from the structure of the semiconductor device of the above-mentioned first exemplary embodiment in a point that an inductor element is mounted on the surface of the substrate.

As shown in FIG. 9, a semiconductor device 60 of the sixth exemplary embodiment has a structure in which the inductor element 7 is mounted on the surface of the substrate 5 and the electrodes 8 is connected electrically with the external electrodes 11 of the substrate 5 electrically via the penetration electrodes 17 formed into the inductor element 7. Although it is desirable to have the inductor element 7 incorporated in the substrate 5 from a point of view of miniaturization, because, by arranging the inductor element 7 on the surface of the substrate which is the case of the sixth exemplary embodiment, damage of the inductor element 7, which tends to occur in the substrate manufacturing process, can be prevented and the substrate 5 can be produced with a high yield, connection reliability is secured.

Meanwhile, a common member with the first exemplary embodiment is given an identical number, and description thereof will be omitted.

Thus, according to the sixth exemplary embodiment, because the inductor element is mounted on the surface of the substrate, almost the same effect as the effect described in the first exemplary embodiment is obtained. In addition, the connection reliability of the substrate is secured.

[Exemplary Embodiment 7]

Figure 10:
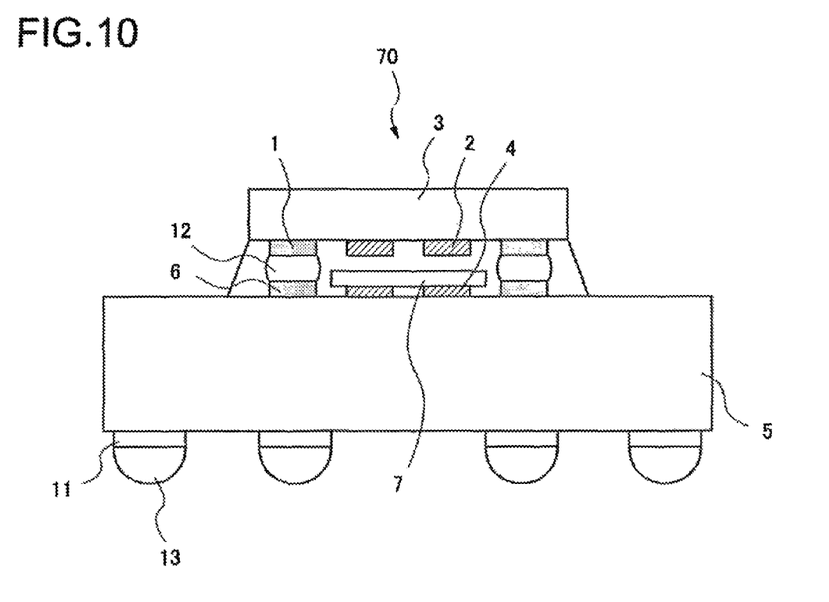
FIG. 10 is a sectional view showing an example of a schematic configuration of a semiconductor device according to a seventh exemplary embodiment of the present invention.

FIG. 10 is a sectional view showing a schematic configuration of a semiconductor device according to the seventh exemplary embodiment of the present invention. The structure of the semiconductor device of this exemplary embodiment is different from the structure of the semiconductor device of the above-mentioned first exemplary embodiment in a point that an inductor element is mounted on an area surrounded by electrodes of a semiconductor element.

As shown in FIG. 10, in a semiconductor device 70 of the seventh exemplary embodiment, the inductor element 7 is mounted around the central part of the semiconductor element 3 that is surrounded by the electrodes 1 arranged in a peripheral part of the semiconductor element 3. Accordingly, the inductor element 7 is formed with a size smaller than the semiconductor element 3. By such structure, miniaturization of the inductor element 7 can become possible and cost reduction can be achieved.

Meanwhile, a common member with the first exemplary embodiment is given an identical number, and description thereof will be omitted.

Thus, according to the seventh exemplary embodiment, because an inductor element is mounted on an area surrounded by electrodes of a semiconductor element, almost the same effect with the effect described in the first exemplary embodiment is obtained. Further, cost reduction of an inductor element can be achieved.

[Exemplary Embodiment 8]

Figure 11:
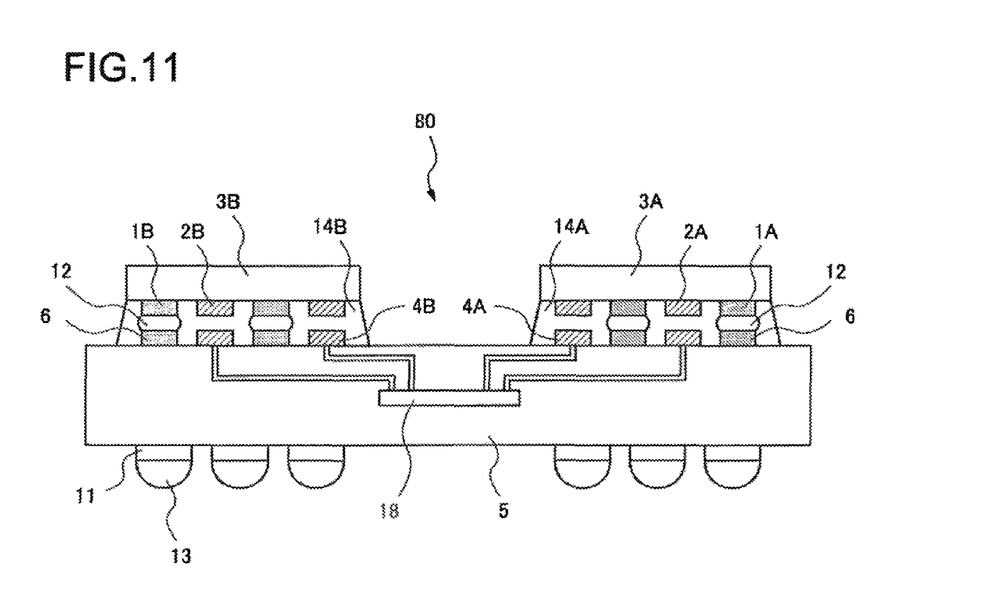
FIG. 11 is a sectional view showing an example of a schematic configuration of a semiconductor device according to an eighth exemplary embodiment of the present invention.

FIG. 11 is a sectional view showing a schematic configuration of the semiconductor device which is the eighth exemplary embodiment of the present invention. The structure of the semiconductor device of this exemplary embodiment is different from the structure of the semiconductor device of the first exemplary embodiment mentioned above in a point that, when applying it to a semiconductor device of a multi-chip type, connection between a plurality of semiconductor elements is performed via a signal transmission element.

In the semiconductor device 80 of the eighth exemplary embodiment, as shown in FIG. 11, connection between a plurality of semiconductor elements 3A and 3B is performed via a signal transmission element 18. The second inductors 4A and 4B are arranged on the surface of the substrate 5, and the signal transmission element 18 connected with the inductors 4A and 4B is incorporated in the substrate 5. The signal transmission element 18 includes a signal conversion function for modulation, demodulation or amplification, and performs a desired processing of a signal inputted from an one end and outputs the processed signal from the other end.

Meanwhile, a common member with the first exemplary embodiment is given an identical number, and description will be omitted.

By such structure, because input/output signals of each of the semiconductor elements 3A and 3B transmitted by electromagnetic coupling are inputted to the signal transmission element 18, applied with desired processing and then outputted, when a plurality of electronic parts are connected as is the case with a semiconductor device of the multi-chip type, input/output signals can be sent and received mutually with high reliability.

Thus, according to the eighth exemplary embodiment, because connection between a plurality of semiconductor elements is performed via a signal transmission element, almost the same effect as the effect described in the first exemplary embodiment is obtained. Also, it has the effect that an input/output signal is sent and received mutually with high reliability.

[Exemplary Embodiment 9]

Figure 12:
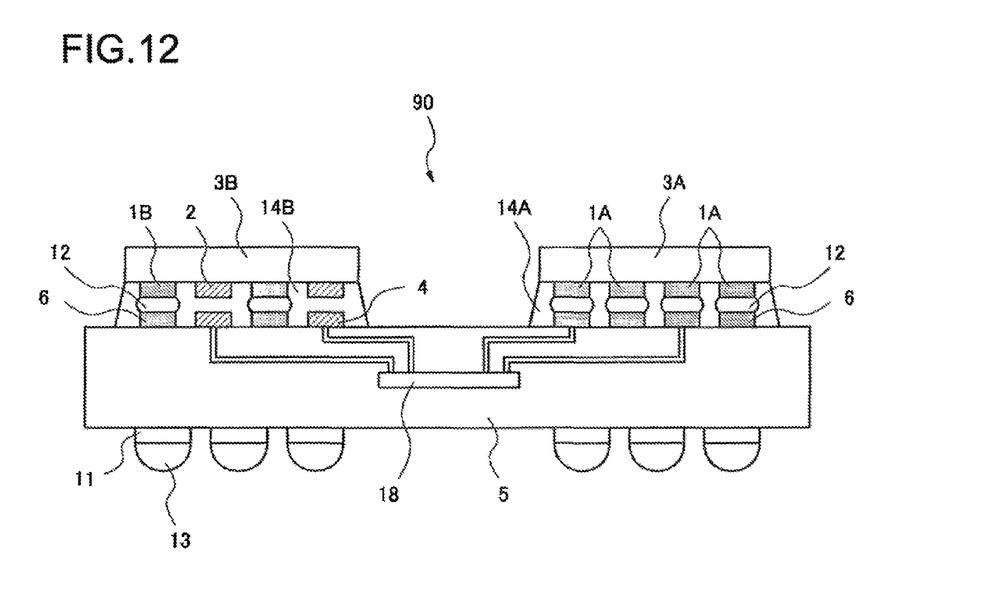
FIG. 12 is a sectional view showing an example of a schematic configuration of a semiconductor device according to a ninth exemplary embodiment of the present invention.

FIG. 12 is a sectional view showing a schematic configuration of a semiconductor device according to the ninth exemplary embodiment of the present invention. The structure of the semiconductor device of this exemplary embodiment is different from the structure of the semiconductor device of the above-mentioned eighth exemplary embodiment in a point that, when connection between a plurality of semiconductor elements are performed via a signal transmission element, all of input-output terminals of one semiconductor element are composed of electrodes for electric connection.

In a semiconductor device 90 of the ninth exemplary embodiment, as shown in FIG. 12, all of one main surface of one semiconductor element 3A, connected via the signal transmission element 18, electrodes 1A are arranged, and the electrodes 1A are electrically connected with the external electrodes 11 via the bumps 12.

By such a structure, a semiconductor device of the multi-chip type can be configured by combining highly universal electronic parts, which carry out transmission of an input/output signal without depending on the electromagnetic coupling necessarily.

Meanwhile, a common member with that of the first exemplary embodiment is given an identical number, and description thereof will be omitted.

Thus, according to the ninth exemplary embodiment, because a semiconductor device of the multi-chip type is configured by combining an electronic part which transmits an input/output signal without depending on electromagnetic coupling, almost the same effect with as the effect described in the first exemplary embodiment is obtained. Further, there is an effect that an input/output signal is sent or received using highly universal electronic parts mutually with high reliability.

Although, in the first exemplary embodiment, an example in which the semiconductor element 3 is mounted on the substrate 5 in the face-down manner by the flip chip connection has been indicated, arrangement of the electrodes 1 for electrical connection and the first inductors 2 for electromagnetic coupling is not limited to this necessarily. That is, both of the electrodes 1 and the first inductors 2 do not need to be arranged on the one main surface of the semiconductor element 3. For example, the semiconductor element 3 may be mounted on the substrate 5 in a face-up manner by an adhesion material not including a metal composition, and the electrodes 1 may be electrically connected to the electrodes 6 of the substrate 5 by wire bonding or the like.

Also, in a semiconductor device according to the above-mentioned exemplary embodiments, a signal can be transmitted contactlessly by the electromagnetic coupling of the inductors, but the present invention is not limited to this. As a method to transmit a signal contactlessly, a capacity connection by a capacitor may be applied. An inductor may be replaced by a capacitor to transmit a signal by capacity coupling. Meanwhile, in the case of the capacity connection by the capacitor, a part or all of inductors are preferably replaced by capacitors in a conformation, in which the electrodes face each other and there is an insulating layer of a low dielectric ratio between the electrodes.

When a penetration via is formed in the semiconductor element 1, the electrodes 1 or the first inductors 2 can be provided on the other main surface of the side opposite to the one main surface. In this case, the electrode 2 and the first inductors 2 are not necessarily arranged on the same main surface of the semiconductor element 3. Further, the first and the second inductors do not need to be arranged in a facing relation, and they only have to be arranged in a relationship where an electromagnetic coupling is possible.

Although illustration of wiring is omitted in a certain figure in each exemplary embodiment or modification, it is clear that the key point of the present invention is not deviated by these.

Although the present invention has been described with reference to the exemplary embodiments and the examples as above, the present invention is not limited to the above-mentioned exemplary embodiments and examples. Various modifications which a person skilled in the art can understand can be performed in the configuration and details of the present invention within the scope of the present invention.

This application claims priority based on Japanese application Japanese Patent Application No. 2009-156330, filed on Jun. 30, 2009, the disclosure of which is incorporated herein in its entirety.

INDUSTRIAL APPLICABILITY

In a case of a multi-chip type semiconductor device in which a plurality of semiconductor elements are mounted on a substrate, because an input/output signal is sent or received by one of inductors or inductor elements once, and a system circuit is configured here and the input/output signal is outputted to outside, the present invention is most suitably applied in particular to a system package.

DESCRIPTION OF SYMBOLS 1, 1A, 1B electrode
2, 2A, 2B first inductor
3, 3A, 3B, 102, 102A, 102B semiconductor element
4, 4A, 4B second inductor
5, 104 substrate (mounting substrate) electrode
7, 7A, 7B inductor element
8 electrode
9 wiring
10, 10A, 20, 30, 30A semiconductor device
40, 50, 60, 70, 80, 90, 100 or 200 semiconductor device
11, 107 external electrode
12, 16, 105, 108 bump (projection-shaped electrode)
13 hemisphere electrode
14, 14A, 14B, 106 sealing body
15 chip part
17 penetration electrode
18 signal transmission element
101 first electrode
102 second electrode

The invention claimed is:

1. A semiconductor device, comprising:
a semiconductor element, including:
a first main surface, on which a first inductor is arranged;
a second main surface; and
a first electrode arranged on said first main surface or said second main surface; and
a substrate, on which said semiconductor element is mounted, said substrate including:
a second inductor, arranged in a position corresponding to said first inductor, for electromagnetically coupling with said first inductor; and
an external electrode for inputting or outputting at least a part of signal inputted to said semiconductor element or outputted from said semiconductor element, said signal being transmitted by a contactless electromagnetic coupling between said first inductor and said second inductor, wherein
said first electrode is arranged on said first main surface adjacent to said first inductor, and
said first inductor and said first electrode are arranged alternately.

2. The semiconductor device according to claim 1, wherein said substrate comprises a second electrode, connected to said first electrode, for inputting to said semiconductor element or outputting from said semiconductor element a signal, which is inputted or outputted by said external electrode but not transmitted by the contactless electromagnetic coupling between said first inductor and said second inductor.

3. The semiconductor device according to claim 2, wherein said first electrode is connected to said second electrode via a projection-shaped electrode, which defines a distance between said semiconductor element and said substrate.

4. The semiconductor device according to claim 3, wherein said projection-shaped electrode determines a position on said first main surface and a distance to said second inductor of said first inductor to transmit said signal inputted to said semiconductor element or outputted from said semiconductor element by the contactless electromagnetic coupling.

5. A semiconductor device, comprising:
a semiconductor element, including:
a first main surface, on which a first inductor is arranged;
a second main surface; and
a first electrode arranged on said first main surface or said second main surface; and
a substrate, on which said semiconductor element is mounted, said substrate including:

a second inductor, arranged in a position corresponding to said first inductor, for electromagnetically coupling with said first inductor; and an external electrode for inputting or outputting at least a part of signal inputted to said semiconductor element or outputted from said semiconductor element, said signal being transmitted by a contactless electromagnetic coupling between said first inductor and said second inductor, wherein said substrate comprises an inductor element having a first surface, on which said second inductor is arranged.

6. The semiconductor device according to claim 5, wherein said inductor element is arranged inside said substrate.

7. The semiconductor device according to claim 5, wherein said second inductor commonly corresponds to said first inductor.

8. The semiconductor device according to claim 6, wherein said semiconductor element is arranged on a side of a second surface of said inductor element, and said second inductor is arranged in a position on said first surface of said inductor element corresponding to said first inductor of said semiconductor element.

9. The semiconductor device according to claim 5, wherein said inductor element is mounted on a surface of said substrate.

10. The semiconductor device according to claim 9, wherein said inductor element is mounted within an area demarcated by said first electrode arranged in a periphery of said semiconductor element.

11. The semiconductor device according to claim 5, wherein said inductor element has a function to modulate, demodulate or amplify a signal inputted to said semiconductor element or outputted from said semiconductor element.

12. A semiconductor device, comprising:
a semiconductor element, including:
a first main surface, on which a first inductor is arranged;
a second main surface; and
a first electrode arranged on said first main surface or said second main surface; and
a substrate, on which said semiconductor element is mounted, said substrate including:
a second inductor, arranged in a position corresponding to said first inductor, for electromagnetically coupling with said first inductor; and
an external electrode for inputting or outputting at least a part of signal inputted to said semiconductor element or outputted from said semiconductor element, said signal being transmitted by a contactless electromagnetic coupling between said first inductor and said second inductor; and
a signal conversion device, for connecting said plurality of semiconductor elements, and for modulating, demodulating or amplifying a signal inputted to at least one of said plurality of semiconductor elements or outputted from at least one of said semiconductor elements.

13. The semiconductor device according to claim 12, wherein
said signal conversion device is incorporated in said substrate.

14. A mounting substrate, for mounting a semiconductor element, which has a first inductor and a first electrode, comprising:
an inductor element, on which a second inductor electromagnetically coupling with said first inductor is arranged in a position corresponding to said first inductor; and
an external electrode for inputting or outputting at least a part of signal inputted to said semiconductor element or outputted from said semiconductor element, said signal being transmitted by a contactless electromagnetic coupling between said first inductor and said second inductor, wherein
said inductor element has a first surface, on which said second inductor is arranged.

15. The mounting substrate according to claim 14, further comprising:
a second electrode, connected to said first electrode, for inputting to said semiconductor element or outputting from said semiconductor element a signal, which is inputted or outputted by said external electrode but not transmitted by the contactless electromagnetic coupling between said first inductor and said second inductor.

16. The mounting substrate according to claim 14, wherein
said semiconductor element is mounted on a side opposite to a side, on which said second inductor of said inductor element is arranged; and
said second inductor is arranged in a position on said first surface of said inductor element corresponding to said first inductor of said semiconductor element.

17. The mounting substrate according to claim 14, wherein
said inductor element is mounted within an area demarcated by said first electrode arranged in a periphery of said semiconductor element, on a surface of said mounting substrate.

18. A manufacturing method of a mounting substrate for mounting a semiconductor element, which has a first inductor and a first electrode, comprising:
forming an inductor element inside said mounting substrate or on a surface of said mounting substrate;
arranging a second inductor for electromagnetically coupling with said first inductor on a first surface of said inductor element in a position corresponding to said first inductor; and
forming an external electrode for inputting or outputting at least a part of signal inputted to said semiconductor element or outputted from said semiconductor element, said signal being transmitted by a contactless electromagnetic coupling between said first inductor and said second inductor.

* * * * *